United States Patent [19]

Adams et al.

[11] Patent Number: 5,771,242
[45] Date of Patent: Jun. 23, 1998

[54] MEMORY ARRAY BUILT-IN SELF-TEST CIRCUIT HAVING A PROGRAMMABLE PATTERN GENERATOR FOR ALLOWING UNIQUE READ/WRITE OPERATIONS TO ADJACENT MEMORY CELLS, AND METHOD THEREFOR

[75] Inventors: Robert Dean Adams, Essex Junction; John Connor, Burlington; Garrett Stephen Koch, Cambridge; Luigi Ternullo, Jr., Colchester, all of Vt.

[73] Assignee: International Business Machines Corporation, Armonk, N.Y.

[21] Appl. No.: 721,601

[22] Filed: Sep. 25, 1996

Related U.S. Application Data

[62] Division of Ser. No. 485,296, Jun. 7, 1995.

[51] Int. Cl.$^6$ ............................................. G01R 31/28
[52] U.S. Cl. ............................................. 371/27.1
[58] Field of Search ...................... 371/27.1, 22.2, 371/22.3, 22.4, 22.5, 22.6

[56] References Cited

U.S. PATENT DOCUMENTS

| | | | |
|---|---|---|---|
| Re. 34,445 | 11/1993 | Hayes et al. ........................ | 371/21.1 |
| 4,962,500 | 10/1990 | Nakagawa .......................... | 371/24 |
| 5,006,787 | 4/1991 | Katirciog et al. . | |
| 5,138,619 | 8/1992 | Fasang et al. . | |
| 5,173,906 | 12/1992 | Dreibelbi et al. . | |
| 5,224,101 | 6/1993 | Popyack, Jr. . | |
| 5,289,403 | 2/1994 | Yetter ............................... | 365/49 |
| 5,301,156 | 4/1994 | Talley . | |
| 5,301,199 | 4/1994 | Ikenaga et al. . | |
| 5,309,447 | 5/1994 | Moskowitz et al. . | |
| 5,331,643 | 7/1994 | Smith ................................. | 371/22.1 |
| 5,390,192 | 2/1995 | Fujieda .............................. | 371/27 |
| 5,481,549 | 1/1996 | Tokuyama .......................... | 371/27 |

*Primary Examiner*—Hoa T. Nguyen
*Attorney, Agent, or Firm*—Schmeiser, Olsen & Watts; Eugene I. Shkurko

[57] ABSTRACT

An ABIST circuit for testing a memory array has a blanket write subcycle (WC), an $RC_3$ subcycle, and an $RC_4$ subcycle. The ABIST circuit includes a programmable pattern generator that provides eight programmable data bits, eight programmable read/write bits, and two programmable address frequency bits to determine the specific test patterns applied to the memory array. The address frequency bits determine how many memory cycles will be performed on each cell of the memory array. In X1 mode, only one memory cycle is performed on each cell during any given subcycle. In X2 mode, two memory cycles are performed on each cell, allowing a cell to be written, then subsequently read in the same subcycle, In X4 mode, four memory cycles are performed on each cell, and in Xg mode, all eight bits of read/write and data are used on each cell, resulting in eight memory cycles for each cell within the memory array.

12 Claims, 3 Drawing Sheets

MEMORY ARRAY BUILT-IN SELF-TEST CIRCUIT HAVING A PROGRAMMABLE PATTERN GENERATOR FOR ALLOWING UNIQUE READ/WRITE OPERATIONS TO ADJACENT MEMORY CELLS, AND METHOD THEREFOR

This application is a division of application No.8/485,296, filed Jun. 7, 1995 pending.

CROSS-REFERENCE TO RELATED APPLICATION

This application is related to a co-pending application Dkt. No. BU9-95034filed Jun.7,1995 as U.S. Ser. No. 08/473,641 entitled abandoned.

BACKGROUND OF THE INVENTION

1. Technical Field

This invention generally relates to testing of integrated circuits, and more specifically relates to built-in self-test circuits and methods implemented on an integrated circuit chip to test the function of a portion of the integrated circuit, such as a memory array.

2. Background Art

Advances in integrated circuits have enhanced the ability to integrate increasingly more circuits on a single chip. As the circuit complexity on a chip increases, so does the need to thoroughly test the circuits. However, many of these circuits have few or no connections that are accessible to external test equipment, making the testing of these circuits by external equipment very difficult or impossible altogether. A general solution to the problem of testing integrated circuits is to embed test circuitry on the chip itself, commonly known as Array Built-In Self-Test (ABIST). ABIST circuits typically test a circuit's function and provide a failure indication if the circuit is not functioning properly.

As the number of circuits integrated onto a single chip increases, the complexity and sophistication of on-chip ABIST circuits also increases. A variety of different types of self-test circuits are known for different applications. One such type of self-test circuit generates random data patterns to apply to the memory array. Examples of random data self-test circuits include: U.S. Pat. No. 5,331,643 "Self-Testing Logic with Embedded Arrays" (issued Jul. 19, 1994 to Smith and assigned to International Business Machines Corp.); U.S. Pat. No. 5,301,199 "Built-In Self Test Circuit" (issued Apr. 5, 1994 to Ikenega et al. and assigned to Nippon Telegraph and Telephone Corp.); U.S. Pat. No. 5,138,619 "Built-In Self Test for Integrated Circuit Memory" (issued Aug. 11, 1992 to Fasang et al. and assigned to National Semiconductor Corp.); and U.S. Pat. No. 5,006,787 "Self-Testing Circuitry for VLSI Units" (issued Apr. 9, 1991 to Katircioglu et al and assigned to Unisys Corp.). All the patents listed above are incorporate herein by reference.

Self-test circuits that generate random data, such as those listed above, cannot be used for deterministic testing of the memory array, i.e., to test the array with a defined sequence of data. In addition, random data cannot place the memory array in a known state, which is required, for example, during burn-in testing. However, other self-test circuits are known which generate programmable data. For example, U.S. Pat. No. 5,224,101 "Micro-Coded Self-Test Apparatus for a Memory Array" (issued Jun. 29, 1993 to Popyack, Jr. and assigned to the United States) discloses a self-test circuit that uses a microcode sequencer to determine the testing algorithm from the contents of a Read Only Memory (ROM), and is incorporated herein by reference. Once the algorithm has been programmed into the ROM, however, the testing algorithm is fixed, and cannot be re-programmed for different test parameters. U.S. Pat. No. 5,301,156 "Configurable Self-Test for Embedded Rams" (issued Apr. 5, 1994 to Talley and assigned to Hewlett Packard Co.) discloses a self-test circuit that has a serial scan path that passes through the address and data portions of the circuit to allow scanning a test vector into the selftest circuit, and to allow scanning the results of the test out of the self-test circuit. While the data may be dynamically changed by scanning in a new test vector, this process of scanning in data each time the data changes during the test is very timeconsuming, making the testing of large memory arrays excessively slow and impractical. The two patents discussed above are incorporated herein by reference.

One example of a relatively sophisticated ABIST circuit is disclosed in U.S. Pat. No. 5,173,906 "Built-In Self Test for Integrated Circuits" (issued Dec. 22, 1992 to Dreibelbis et al.), which is also incorporated herein by reference. The ABIST circuit disclosed by Dreibelbis et al. provides five fixed patterns and one programmable (PG) pattern for testing a memory array. The PG pattern provides for greater flexibility in testing a circuit such as a memory array by providing configuration variables that determine the specific programming pattern and sequence to be applied by the ABIST circuit to the cells within the memory array.

The PG pattern generator within the ABIST circuit of Dreibelbis et al. initializes appropriate configuration variables using scan chain initialization, a technique that is known in the art. The combination of the four programmable R/W latches and four programmable data latches provides $2^8$, or 256 different programming sequences that could be performed on each memory address. The PG pattern typically consists of three subcycles: WC, RC3, and RC4. A subcycle defines the R/W operation performed on the memory array under test as its entire address space is ascended or descended by the ABIST state machine's address counter. When the last address is reached, a new subcycle is commenced and the array's address space is again traversed. The WC subcycle is a blanket write cycle, wherein every cell within the memory array is written with the same data, either a zero or a one. The RC3 subcycle is then performed, followed by the RC4 subcycle, during both of which the cells within the memory array may be read or written. It is typically during the RC3 and RC4 subcycles that the programmable operations are performed.

An example is shown below to illustrate the operation of the ABIST circuit disclosed by Dreibelbis et al. during the RC3 and RC4 subcycles. The array for this example is 4×4, four wordlines (WL) by 4 bit lines (BL), The state of the array is shown after completion of 64 cycles (4 operations per cell×16 addresses).

The initialized state of the programmable parameters are shown below:

1) programmable data latches=0011
2) programmable R/W latches=WRWR
3) invert on LSWA⊗LSBA
4) count up, ripple bit (RB)

The array shown below represents the state of the array after all four memory cycles are performed on each cell within the array:

```
1010
0101
1010
0101
```

The address counter starts at WL00, BL00 (with bit lines represented by columns and word lines represented by rows), and the bits of the programmable data latches are matched with their corresponding counterparts in the R/W latches to arrive at a desired memory cycle. In this example, the first cell is written with a zero (W0), and the zero is read in the next cycle (R0). In the third cycle, the cell is written with a one (W1) and in the fourth cycle, the one is read (R1). These four cycles are noted in shorthand as a W0R0W1R1 sequence. The bit address is then incremented (ripple bit mode (RB)), making the new address WL00, BL0 1. With the "invert on LSBA" option active, the second cell receives a W1R1W0R0 sequence, since the least significant bit address (LSBA) is high. The bit address is then incremented (RB mode), resulting in WL00, BL02, and a W0R0W1R1 sequence is executed. The bit address is then incremented in RB mode, resulting in WL00, BL03, and a W1R1W0R0 sequence is executed. The next increment in bit address results in an address of WL01, BL00. Because the "invert data on LSWA"option is active and the least significant word address (LSWA) is high, this cell receives a W1R1W0R0 sequence, i.e., data is inverted. Address is then incremented in RB mode to WL01, BL01. Because the "invert data on LSBA" and "invert data on LSWA" options are exclusive ORed, no data inversion occurs at this address, resulting in a W0R0W1R1 sequence. This process continues until all sixteen memory cells within the array have each undergone four memory cycles each according to the programmable parameters that are active.

The lowest pattern repeat frequency is two in both the bit (column) and word (row) dimensions. In the bit dimension, the pattern repeat frequency is dependent on the "invert data on LSBA" flag. If the flag is not set, the pattern is repeated for every bit. If the flag is set, the pattern is repeated every other bit. In the word dimension, the pattern repeat frequency is dependent on the "invert data on LSWA" flag. If both "invert data on LSBA" and "invert data on LSWA"flags are set, then the two are exclusive ORed, as described above.

The prior art ABIST architecture by Dreibelbis et al. described above allows programming a specific set of read/write (R/W) cycles to a memory array, but the same R/W cycles are performed at each address within the array. In addition, the programmable pattern generator of Dreibelbis et al. includes a two-bit counter and a decoder for determining which data latch and which R/W control latch should source data and control in a given memory cycle. The data generation path therefore includes the decode logic, which adds delay to the critical data generation path, slowing the execution of the ABIST.

In addition, as performance and technology advances continue, characterization of memory arrays may reveal as yet unknown memory sensitivities for which no ABIST detection pattern has been implemented. Thus, a programmable pattern generator is needed which allows performing different R/W operations to adjacent cells within a memory array, to permit testing for sensitivity from one cell to adjacent cells, which is not possible using prior art ABIST circuits.

DISCLOSURE OF INVENTION

According to the present invention, a programmable pattern generator for an ABIST circuit allows for different R/W data operations to be performed at adjacent address locations within a memory array. The programmable pattern generator suitably comprises a state machine that includes a data generator, a read/write controller, and a frequency controller. The data generator is programmed with the appropriate data pattern for the memory array; the read/write controller is programmed with the appropriate read/write pattern for the memory array; and the frequency controller is programmed with the appropriate frequency information to determine the number of read/write operations per cell in the memory array. Assuming an eight bit data generator and an eight bit read/write controller, the frequency controller allows selecting how the eight read/write operations are allocated among different cells within the memory array. For example, when the frequency controller is in X8 mode, all eight read/write operations are performed on a single cell. When the frequency controller is in X4 mode, the first four read/write operations are performed on one cell, with the second four read/write operations being performed on the next cell. When the frequency controller is in X2 mode, the first two read/write operations are performed on a first cell, the next two read/write operations are performed on a second cell, the next two read/write operations are performed on a third cell, and the last two read/write operations are performed on a fourth cell. When the frequency controller is in X1 mode, each of the eight read/write operations are performed on a different cell. The combination of programmable data, programmable read/write sequence, and programmable frequency allows for deterministic testing of a memory array by providing unique read/write sequences to adjacent cells, and provides a far greater number of possible combinations than the prior art, allowing for more rigorous testing for cell-to-cell sensitivities.

The foregoing and other objects, features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Figure 1:
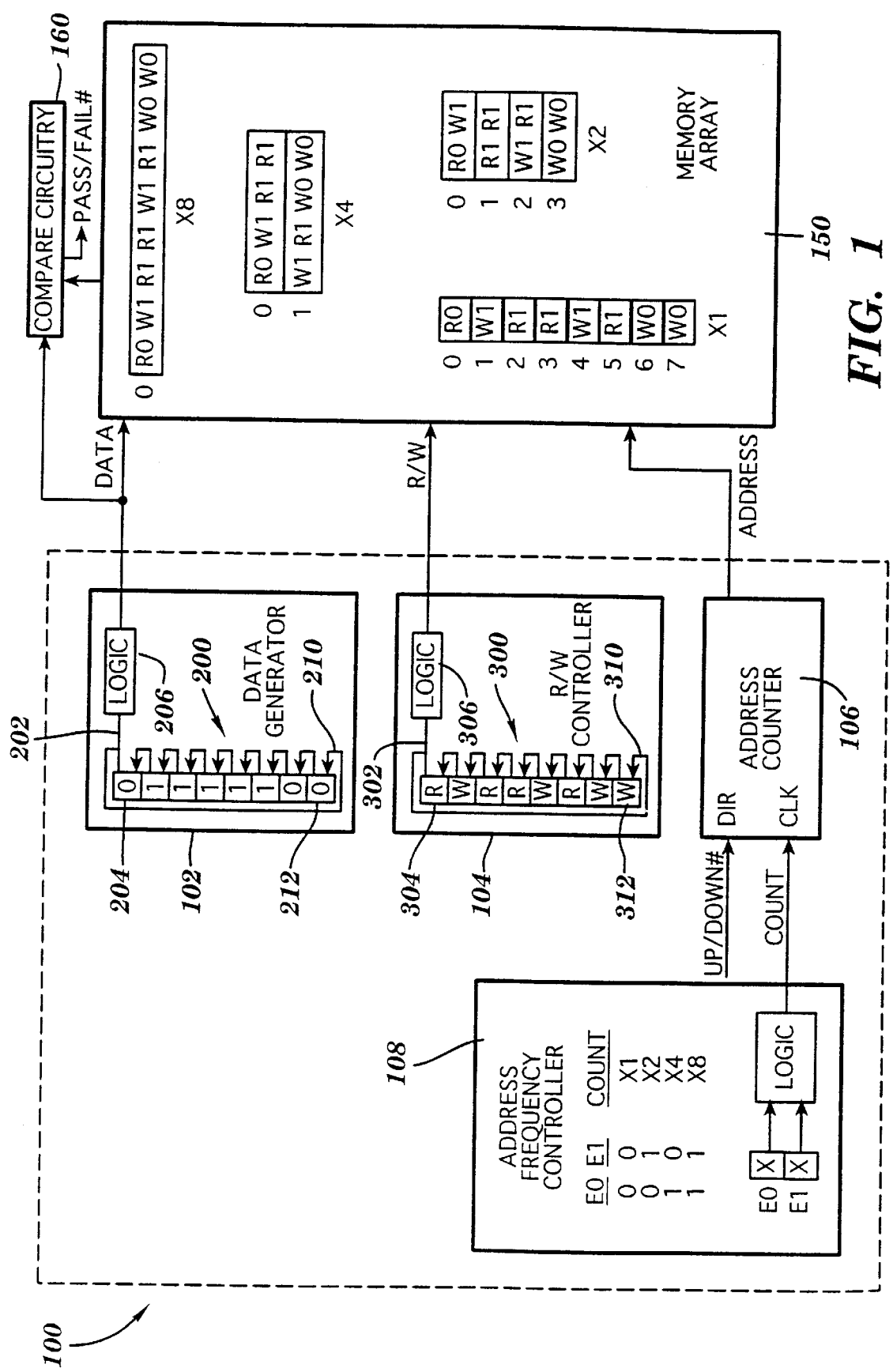
FIG. 1 is a block diagram of a programmable pattern generator for an ABIST circuit in accordance with the present invention.

Referring to FIG. 1, an ABIST circuit in accordance with the present invention includes a programmable pattern generator circuit 100 for testing a memory array 150. Pattern generator 100 suitably comprises a data generator 102, a read/write (R/W) controller 104, an address counter 106, and an address frequency controller 108. Data read from memory array 150 is compared against the data written using compare circuitry 160, which generates a PASS/FAIL# signal to indicate whether the comparison succeeded. The configuration of data generator 102 and R/W controller 104, along with the presence of address frequency controller 108, significantly enhances the operation of programmable pattern generator 100 when compared with the prior art by providing the capability of writing different R/W patterns to adjacent memory cells within memory array 150, and by removing the decode logic in the data generation path of the prior art pattern generator.

Data generator 102 generates the data to be read or written during testing on its DATA output to memory array 150. Data generator 102 suitably comprises an eight bit data latch 200 arranged in a shift register configuration and coupled to logic 206. Initial data values for data generator 102 are stored in data latch 200 using known methods of scan chain initialization. The output 202 of the least significant bit 204 of data latch 200 is suitably coupled to the input 210 of the most significant bit 212 to form a barrel shifter, so the data pattern stored in data generator 102 during scan chain initialization may be preserved and used repetitively throughout the test.

Read/write (R/W) controller 104 generates the read and write control signals R/W to memory array 150 during testing. R/W controller 104 suitably comprises an eight bit RIW latch 300 arranged in a shift register configuration. Initial values for R/W controller 104 are stored in R/W latch 300 via scan chain initialization. The output 302 of the least significant bit 304 of R/W latch 300 is suitably coupled to the input 310 of the most significant bit 312, forming a barrel shifter similar to data latch 200.

Address counter 106 generates an ADDRESS output to the address line inputs of memory array 150 during testing. Address counter 106 suitably comprises a binary counter with a clock input CLK driven by the COUNT output of address frequency controller 108. An UP/DOWN# signal coupled to a direction input DIR of address counter 106 determines whether address counter 106 counts up (ascending addresses) or counts down (descending addresses). Address counter 106 suitably accesses sequential cells within memory array 150 by either incrementing or decrementing the ADDRESS output, depending on the state of the DIR input.

Address frequency controller 108 determines when to pulse its COUNT output to cause address counter 106 to drive the next address to memory array 150. The frequency of COUNT determines how many of the eight programmed R/W cycles are performed on a cell before the address is changed. COUNT may be pulsed either on every memory cycle, every other memory cycle, every fourth memory cycle, or every eighth memory cycle, depending on the state of two encode inputs E0 and El, which are set by scan chain initialization. X1 may be suitably effected by initializing both E0 and E1 to zero. In X1 mode, COUNT pulses once for every memory cycle, causing address counter 106 to change address for every cycle to memory array 150. Thus, in X1 mode, only one R/W operation is performed for each cell during each subcycle. Since each cell within memory array 150 is only accessed once, a write should probably be performed in subcycle RC3 followed by a read in subcycle RC4. This arrangement would render the WC blanket subcycle useless, since subcycle RC3 is essentially performing a blanket write. Logic within the ABIST circuit (not shown) could detect X1 mode, and skip the WC subcycle, thereby saving time by not performing an unneeded step in the test. X2 mode may be suitably effected by initializing E0 to zero and E1 to one. In X2 mode, COUNT pulses once for every two memory cycles, causing address counter 106 to change address on every other cycle. Thus, in X2 mode, two R/W operations are performed for each cell during each subcycle. X4 mode may be suitably effected by initializing E0 to one and E1 to zero. In X4 mode, COUNT pulses once for every four memory cycles, causing address counter 106 to change address for every fourth access to memory array 150. Thus, in X4 mode, four R/W operations are performed for each cell during each subcycle. X8 mode may be suitably effected by initializing both E0 and E1 to one. In X8 mode, COUNT pulses once for every eight memory cycles, causing address counter 106 to change address for every eighth access to memory array 150. Thus, in X8 mode, all eight R/W operations defined by data generator 102 and R/W controller 104 are performed for each cell during each subcycle.

Figure 2:
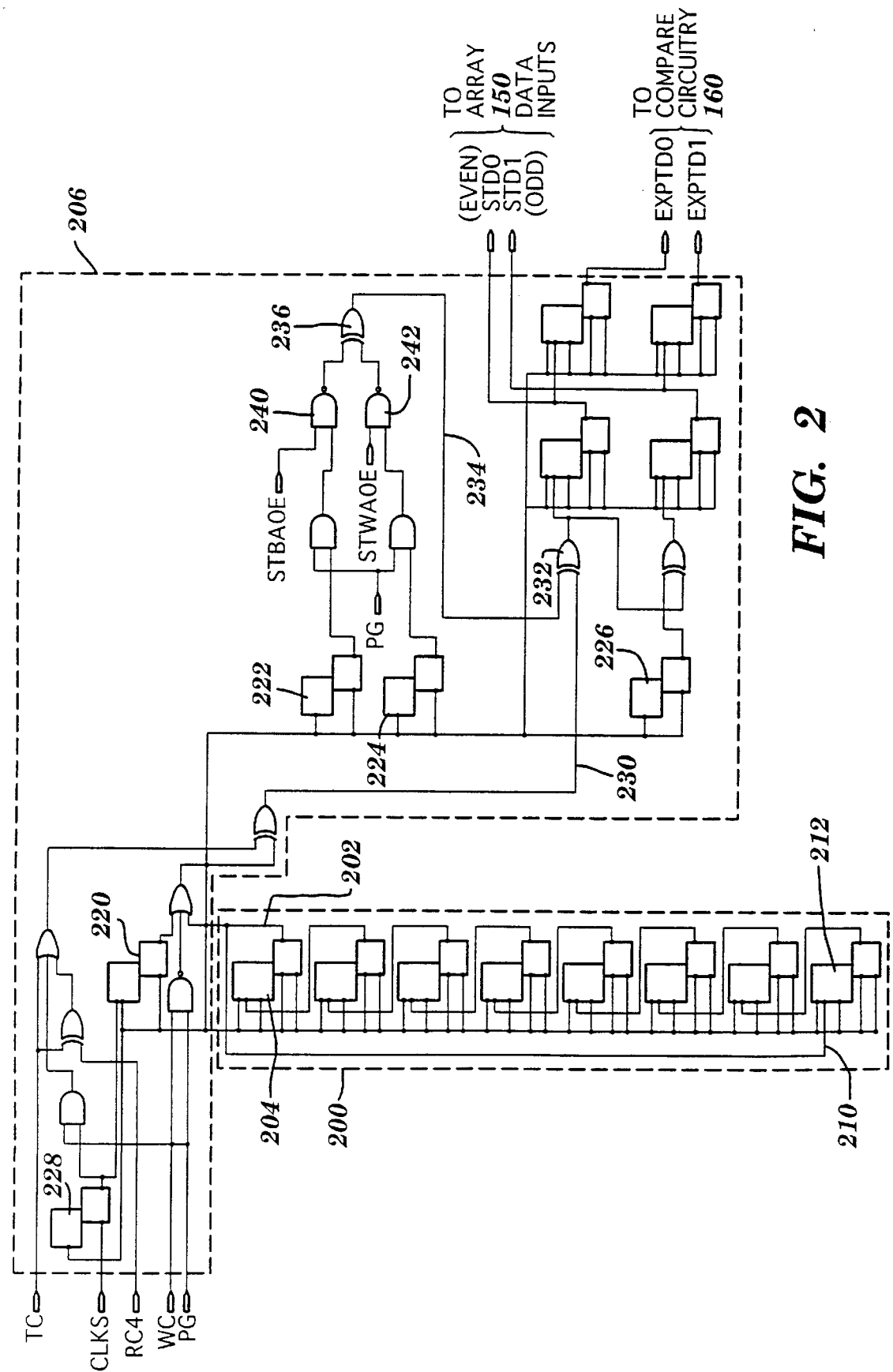
FIG. 2 is a schematic diagram of one specific implementation of the data generator of FIG. 1.

One suitable specific configuration of data latch 200 and logic 206 is shown in FIG. 2. In addition to data latch 200, other latches within data generator 104 are initialized during scan chain initialization to determine the function of logic 206. For example, latch 220 contains the value of a blanket write bit. When latch 220 is written with a one, blanket ones are written to memory array 150 during the blanket write WC subcycle. When latch 220 is written with a zero, blanket zeros are written to memory array 150 during the WC subcycle. Latch 222 contains the "invert on LSBA" flag. When true (high), the output of gate 240 goes high when the least significant bit of bit address STBAOE is high. Latch 224 contains the "invert on LSWA" flag. When true, the output of gate 242 goes high when the least significant bit of word address STWAOE is high. The output of gates 240 and 242 are exclusive ORed by gate 236 to cause no inversion of data on signal line 230 when both flags are set and the least significant bit of the bit address (LSBA) and the least significant bit of the word address (LSWA) are both high. The output 234 of gate 236 is then exclusive ORed with data on signal line 230, to invert the data output when appropriate, as indicated by flags 222 and 224. Another latch 226 contains a "complement odd data bit" flag which, when true, causes every other data bit in the data pattern stored in data latch 200 to be inverted before being output to memory array 150. Yet another latch 228 contains an "invert data" flag which, when true, inverts the data output from data latch 200. Latches 220–228 are all initialized via scan chain initialization.

Figure 3:
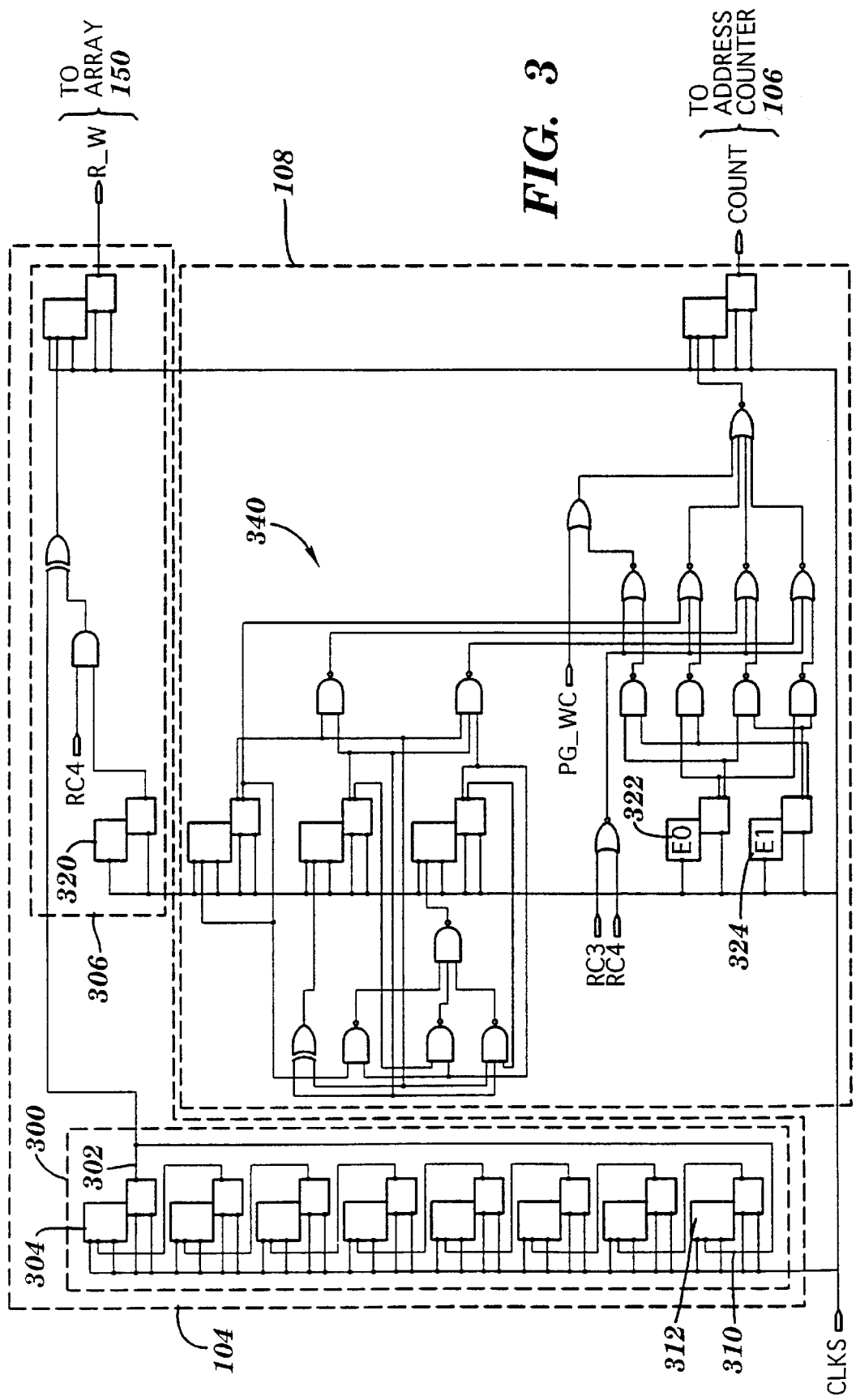
FIG. 3 is a schematic diagram of the read/write controller and the frequency controller of FIG. 1.

A suitable specific configuration for R/W controller 104 and address frequency controller 108 is shown in FIG. 3. R/W latch 300 contains bits which indicate whether each cycle is a read cycle or a write cycle to memory array 150, with a zero suitably indicating a read cycle and a one suitably indicating a write cycle. These eight bits of R/W latch 300 correspond to the eight bits of data stored in data latch 200. For example, if the least significant bit stored in R/W latch 300 is a zero, and the least significant bit stored in data latch 200 is a one, the first operation to memory array 150 will be a read of one at the current address. During the next cycle, the next bit of R/W latch 300 will be output with the next bit of data latch 200, and so on until all eight bits of both latches have been output, defining a pattern of eight memory accesses. Note that the four possible accesses for each memory cycle are a read of zero, a read of one, a write of zero, and a write of one.

In addition to data latch 200, other latches within R/W controller 104 are also initialized during scan chain initialization to determine the function of logic 306. For example, latch 320 contains an "invert R/W control during RC4" flag which, when true (high), causes R/W to array 150 to be inverted during the RC4 subcycle. In addition, other latches 322 and 324 within address frequency controller 108 are also initialized during scan chain initialization. Latch 322 corresponds to E0 and latch 324 corresponds to E1. The values of E0 and E1 determine how many memory cycles are performed between COUNT pulses, with E0=0 and E1=0 corresponding to X1 mode, E0=0 and E1=1 corresponding to X2 mode, E0=1 and E1=0 corresponding to X4 mode, and E0=1 and E1=1 corresponding to X8 mode.

The presence of address frequency controller 108, coupled with the increased number of bits in data latch 200 and RIW latch 300, greatly increases the number of possible test sequences that PG pattern generator 100 can generate when compared with the prior art. Whereas the prior art PG pattern generator only had four data latches and four R/W latches, resulting in $2^8$ (256) combinations of patterns, pattern generator 100 in accordance with the present invention gives rise to $2^{16}$ combinations from the eight data latches and eight R/W latches, plus an additional two bits from the ability to program address frequency controller 108 to operate in one of four different states, for a total of $2^{18,}$ or 262,144 possible programmable pattern combinations, a substantial improvement over the 256 patterns available by using the prior art PG pattern generator of Dreibelbis et al.

The function of the various modes of PG pattern generator 100 (i.e., X1, X2, X4 and X8) may be best understood in reference to some specific examples. Assume a 4×8 memory array (four word lines, eight bit lines) is to be tested using X1 mode. For the following programmed conditions during the RC3 subcycle:

1) Data=01100110
2) R/W=WWWWWWWW
3) invert R/W control during RC4
4) ripple bit (RB)
5) invert data on LSWA the following array results, with a resulting repeat frequency of four in the bit dimension (i.e., every four bits in the bit direction repeat) and two in the word dimension (i.e., every two bits in the word direction repeat):

```
01100110
10011001
01100110
10011001
```

Since each memory cycle is to a different memory cell in X1 mode, each cell is accessed only once, resulting in only one step in the sequence to each cell. For the following programmed conditions during the RC4 subcycle:

1) Data=01100110
2) RIW=WWWWWWWW
3) invert R/W control during RC4
4) ripple bit (RB)
5) invert data on LSWA the same array pattern is verified against the array pattern stored during RC3

```
01100110
10011001
01100110
10011001
```

This example above demonstrates that, in the XI mode, writes are typically performed during RC3 while reads are performed during RC4, eliminating the need to perform the WC blanket write subcycle. Another example below demonstrates the versatility of X1 mode. Assume an 8×4 array (eight word lines, four bit lines) is to be tested using X1 mode. For the following programmed conditions during the RC3 subcycle:

1) Data=00001111
2) R/W=WWWWW
3) invert R/W control during RC4
4) ripple word (RW)
5) invert data on LSBA the following array results, with a resulting repeat frequency of two in the bit dimension and eight in the word dimension:

```
0101
0101
0101
0101
1010
1010
1010
1010
```

For the following programmed conditions during the RC4 subcycle:

1) Data=00001111
2) R/W=WWWWWWWW
3) invert R/W control during RC4
4) ripple word (RW)
5) invert data on LSBA the same array pattern is verified against the array pattern stored during RC3

```
0101
0101
0101
0101
1010
1010
1010
1010
```

In X2 mode, a cell is accessed for two consecutive memory cycles. This allows a cell to be written and its contents checked in the next memory cycle with a read operation within the same subcycle. Assume a 4×4 array is to be tested using X2 mode. For the following programmed conditions during the RC3 subcycle:

1) Data=11111100
2) R/W =RWRWRWRW
3) ripple word (RW)
4) invert data on LSBA the following array results, with a repeat frequency of two in the bit dimension and four in the word dimension:

```
1010
1010
1010
0101
```

This array results from performing a R1W1 to WL00, BL00, followed by a R1W1 to WL01, BL00, followed by a R1W1 to WL100, BL00, followed by a R0W0 to WL11, BL00. Note that the next access is to WL00, BL01, which will cause data to be inverted due to the invert data on LSBA flag being set. The RC4 cycle may use the same programmed conditions as the RC3 cycle, resulting in RC4 repeating the test of RC3, or may proceed to a different test altogether. Note that, using X2 mode, it is possible to apply four unique RIW data sequences to four adjacent cells in the bit or word dimension.

In X4 mode, each cell is accessed for four consecutive memory cycles. This means that half the contents of the data and R/W latches are used on the current address with the remaining four bits being used on the next address. The maximum pattern repeat frequency is two, since every other cell sees the same sequence. Assume a 2×2 array is to be tested using X4 mode. For the following programmed conditions during the WC subcycle:

1) Prog. Blanket Write Data=1
2) ripple bit (RB)
4) invert data on LSBA⊗LSWA the following array results:

```
10
01
```

For the following programmed conditions during the RC3 subcycle:

1) Data=10011111
2) R/W=RWRWRWWR
3) ripple bit (RB)
4) invert data on LSBA⊗LSWA the same array results:

```
10
01
```

This array results from performing a R1W0R0W1 to WL0, BL0, followed by a R1W1W1R1 to WL0, BL1 (with data inverted due to LSBA), followed by a R1W0R0W1 to WL1, BL0 (with data inverted due to LSWA), followed by a R1W1W1R1 to WL1, BL1 (with true data due to LSBA⊗LSWA). The RC4 cycle may use the same programmed conditions as the RC3 subcycle, resulting in RC4 repeating the test of RC3, or may be modified for a different test. X4 mode allows two unique R/W data sequences on two adjacent cells in the bit or word dimension.

In X8 mode, each cell is accessed for eight consecutive memory cycles. This means that the entire contents of the data and R/W latches are used on each cell. Assume a 2×2 array is to be tested using X8 mode. For the following programmed conditions during the WC subcycle:

1) Prog. Blanket Write Data=0
2) ripple bit (RB)

the following array results:

```
00
00
```

For the following programmed conditions during the RC3 subcycle:

1) Data=00000001
2) R/W=RRRRRRRW
3) ripple word (RW) the following array results:

```
11
11
```

This array results from performing a R0R0R0R0R0R0R0W1 to WL0, BL0, followed by a the same sequence to the other three addresses (with no data inversion).

For the following programmed conditions during the RC4 subcycle:

1) Data=11111110
2) R/W=RRRRRRRW
3) ripple word (RW)
4) invert data the following array results:

```
00
00
```

The examples above illustrate the versatility provided by the combination of eight data latches, eight read/write latches, and four frequency states in accordance with the present invention.

The prior art PG pattern generator of Dreibelbis et al. offers the following programmable features:

1) programmable four bit data pattern
2) programmable four bit R/W pattern
3) invert data during RC4
4) invert data on LSWA
5) invert data on LSBA
6) complement odd data bit
7) ripple bit address (RB)/ripple word address (RW)
8) programmable maximum address Compare the prior art features above to the features of the present invention, as listed below, with new features denoted by the letter A:

1A) programmable eight bit data pattern
2A) programmable eight bit R/W pattern
3) invert data during RC4
4) invert data on LSWA
5) invert data on LSBA
6) complement odd data bit
7) ripple bit address (RB)/ripple word address (RW)
8) programmable maximum address
9A) programmable two bit frequency pattern
10A) invert R/W control during RC4
11A) invert data on LSWA ★ invert data on LSBA
12A) invert data on second LSWA ★ invert data on second LSBA where ★=boolean function, such as AND, OR, NAND, NOR, XOR, etc.

The boolean function of LSWA⊗LSBA is shown in detail in FIG. 2. Additional logic for different boolean combinations of LSWA and LSBA may be provided by conventional circuits and methods known to one of ordinary skill in the art. A variety of different boolean functions, however, are within the scope of the present invention.

In addition to greatly increased capability and flexibility, the programmable pattern generator in accordance with the present invention eliminates the counter and decoding scheme of the prior art. By using the shift register technique for both the data latch and the R/W latch, the counter and decoder are removed from the critical data generation path, which reduces the time to generate data and thereby increases system performance. This improvement removes the counter and decoder while adding only nominal logic for the additional data and read/write latches and the other logic associated with the added programmable features. The present invention thus achieves substantially improved operation for only a minimal addition of circuitry and complexity.

While the invention has been particularly shown and described with reference to a preferred exemplary embodiment thereof, it will be understood by those skilled in the art that various changes in form and details may be made therein without departing from the spirit and scope of the invention. For example, expanding the number of bits in the data and read/write latches, or expanding the number of bits or states for the address frequency controller, in order to achieve an even higher number of possible sequences is expressly within the scope of the present invention. In addition, it will be understood that, while various of the conductors or connections are shown in the drawing as single lines, they are not so shown in a limiting sense, and may comprise plural conductors or connections, as is understood in the art.

We claim:

1. An on-chip built-in test circuit for a memory array comprising:

a programmable pattern generator coupled to the memory array, comprising:

a programmable read/write controller receiving a read/write sequence via scan chain initialization for providing independent read/write control to adjacent cells within the memory array, the read/write sequence defining a plurality of read/write cycles; a programmable data generator receiving a data sequence via scan chain initialization for providing independent data to adjacent cells within the memory array the data sequence defining data corresponding to each of the plurality of read/write cycles; and a programmable address frequency controller receiving a frequency value via scan chain initialization for determining the number of cycles to the memory array which the pattern generator performs at each address of the memory array; the programmable pattern generator performing a number of cycles at each address determined by the frequency value, each cycle performing one of the plurality of read/write cycles as determined by the read/write sequence, with corresponding data as determined by the data sequence.

2. The on-chip built-in test circuit of claim 1 further comprising an address counter coupled to the address frequency controller and to the memory array, the address frequency controller further including a clock output which is pulsed once for each of the number of cycles to the memory array which the pattern generator performs at each address of the memory array, the address counter providing an address to the memory array and counting to the next address in response to the clock output from the address frequency controller.

3. The on-chip built-in test circuit of claim 1 wherein the read/write controller comprises a plurality of read/write latches forming a barrel shift register.

4. The on-chip built-in test circuit of claim 3 wherein the plurality of read/write latches comprises at least eight read/write latches.

5. The on-chip built-in test circuit of claim 1 wherein the data generator comprises data latches forming a barrel shift register.

6. The on-chip built-in test circuit of claim 5 wherein the plurality of data latches comprises at least eight data latches.

7. An on-chip built-in test circuit for a memory array comprising: a programmable pattern generator state machine coupled to the memory array, comprising:

a programmable read/write controller comprising at least eight read/write latches forming a first barrel shift register having an output providing data to the memory array and having an input receiving a read/write sequence via scan chain initialization, the read/write sequence defining a plurality of read/write cycles;

a programmable data generator comprising at least eight data latches forming a second barrel shift register having an output providing read/write control to the memory array and having an input receiving a data sequence via scan chain initialization, the data sequence defining data corresponding to each of the plurality of read/write cycles;

an address frequency controller receiving a frequency value via scan chain initialization and having a clock output which is pulsed once for each of the number of cycles to the memory array which the pattern generator performs at each address of the memory array; an address counter coupled to the address frequency controller and to the memory array, the address counter providing an address to the memory array and counting to the next address in response to the clock output from the address frequency controller; the programmable pattern generator performing a number of cycles at each address as determined by the frequency value, each cycle performing one of the plurality of read/write cycles as determined by the read/write sequence, with corresponding data as determined by the data sequence and wherein the read/write sequence and the data sequence performed by the programmable pattern generator at each address can differ between adjacent addresses.

8. The on-chip built-in test circuit of claim 7 wherein the address frequency controller pulses its clock output once for every cycle to the memory array.

9. The on-chip built-in test circuit of claim 7 wherein the address frequency controller pulses its clock output once for every two cycles to the memory array.

10. The on-chip built-in test circuit of claim 7 wherein the address frequency controller pulses its clock output once for every four cycles to the memory array.

11. The on-chip built-in test circuit of claim 7 wherein the address frequency controller pulses its clock output once for every eight cycles to the memory array.

12. A method for testing a memory array that allows for unique read/write operations to adjacent memory cells within the memory array, the method comprising the steps of:

providing a programmable pattern generator coupled to the memory array, comprising:

a programmable read/write controller coupled to a read/write control input of the memory array;

a programmable data generator coupled to data inputs of the memory array;

a programmable address counter coupled to address inputs of the memory array;

and an address frequency controller coupled to a clock input of the address counter, for determining a number of cycles to the memory array the pattern generator applies by a programmed test pattern before pulsing the clock input;

programming an appropriate read/write pattern into the read/write controller via scan chain initialization;

programming an appropriate data pattern into the data generator via scan chain initialization;

programming an appropriate frequency pattern via scan chain initialization into the address frequency controller to determine the number of cycles for which the pattern generator applies the programmed test pattern at each address of the memory array;

applying at least a first portion of the programmed test pattern for at least one cycle to the memory array at a first address contained by the address counter;

advancing the address counter to the next address by pulsing the clock input of the address counter by the address frequency controller after the pattern generator applies the programmed test pattern the number of cycles to the memory array determined by the address frequency controller: and applying at least a second portion of the programmed test pattern for at least one cycle to the memory array at the next address contained by the address counter.

* * * * *

UNITED STATES PATENT AND TRADEMARK OFFICE
CERTIFICATE OF CORRECTION

Page 1 of 2

PATENT NO. : 5,771,242
DATED : June 23, 1998
INVENTOR(S) : Adams et al.

It is certified that error appears in the above-identified patent and that said Letters Patent is hereby corrected as shown below:

On the title page item [57],

In the abstract the text of the second line "$RC_3$" should read --RC3-- and "$RC_4$" should read --RC4--. In the 14th line of the Abstract the text "Xg" should read --X8--

In Column 1, line 15, the text "abandoned" should read --Enhanced Built-In Self-Test Circuit and Method-- after 08/473,641, should read -- abandoned,--

In Column 5, line 60, should have a paragraph indent at the first word "X2".

In Column 7, line 5, the text "RIW" should read --R/W--

In Column 8, line 2, the text "2) R/W = WWWWW" should read --2) R/W = WWWWWWWWWW--

In Column 8, line 57, the text "R1W1 to WL01 " should read --R1W1 to WL10--

In Column 9, a new paragraph should begin with "the" at line 11

In Column 9, a new paragraph should begin with "the" at line 24

In Column 10, a new paragraph should begin with "the" at line 7

In Column 10, Line 31, the text "eight" should read --eight--

In Column 10, Line 32, the text "eight" should read --eight--

In Column 11, a new paragraph should begin with "a" at line 25

UNITED STATES PATENT AND TRADEMARK OFFICE
CERTIFICATE OF CORRECTION

PATENT NO. : 5,771,242
DATED : June 23, 1998
INVENTOR(S) : Adams et al.

It is certified that error appears in the above-identified patent and that said Letters Patent is hereby corrected as shown below:

In Column 11, a new paragraph should begin with "the" at line 34

In Column 11, a new paragraph should begin with "a" at line 62

In Column 12, a new paragraph should begin with "an" at line 14

In Column 12, a new paragraph should begin with "the" at line 19

Signed and Sealed this

Fifth Day of January, 1999

Attest:

*Attesting Officer*

*Acting Commissioner of Patents and Trademarks*